US009111706B2

(12) United States Patent
Chen et al.

(10) Patent No.: US 9,111,706 B2
(45) Date of Patent: Aug. 18, 2015

(54) TOUCH SENSING DEVICE AND A METHOD OF FABRICATING THE SAME USING BONDING MARKS ON NON-BONDING SURFACE OF FPCB

(71) Applicants: Jiadong Chen, Xiamen (CN); Pingping Huang, Sanming (CN); Jianxing Luo, Jianyang (CN); Yau-Chen Jiang, Hsinchu (TW)

(72) Inventors: Jiadong Chen, Xiamen (CN); Pingping Huang, Sanming (CN); Jianxing Luo, Jianyang (CN); Yau-Chen Jiang, Hsinchu (TW)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 124 days.

(21) Appl. No.: 13/682,692

(22) Filed: Nov. 20, 2012

(65) Prior Publication Data

US 2014/0139445 A1  May 22, 2014

(30) Foreign Application Priority Data

Nov. 27, 2011  (CN) .......................... 2011 1 0401077

(51) Int. Cl.
*H01H 65/00* (2006.01)
*G06F 3/041* (2006.01)
(Continued)

(52) U.S. Cl.
CPC .............. *H01H 65/00* (2013.01); *G06F 3/041* (2013.01); *H05K 1/0269* (2013.01); *G06F 3/0202* (2013.01); *G06F 2203/04103* (2013.01); *H01L 23/544* (2013.01); *H01R 12/62* (2013.01); *H05K 3/0008* (2013.01); *H05K 3/323* (2013.01); *H05K 3/361* (2013.01); *H05K 3/4638* (2013.01); *H05K 2201/09918* (2013.01);
(Continued)

(58) Field of Classification Search
CPC ................. H05K 3/361–3/365; H05K 3/4638; H05K 3/0008; H05K 3/323; H05K 1/0266; H05K 1/0268; H05K 1/0269; H05K 7/1454; H05K 7/1452; H05K 13/0015; H05K 2203/048; H05K 2203/16; H05K 2203/161–2203/163; H05K 2203/165–2203/168; H05K 2201/10053; H05K 2201/10128; H05K 2201/09918; H01L 23/544; H01L 23/4012; H01R 12/62; Y10T 29/49105; H01H 65/00
USPC ........... 345/173, 174; 361/749, 760; 174/261; 349/12, 149, 150, 151, 152, 158, 187; 356/401; 257/88, 774, 797, 688, 620; 439/67
See application file for complete search history.

(56) References Cited

U.S. PATENT DOCUMENTS 5,576,135 A * 11/1996 Nishikawa ............... 430/124.12
5,670,994 A * 9/1997 Kawaguchi et al. .......... 345/206
(Continued)

FOREIGN PATENT DOCUMENTS

JP  2003131584 A  5/2003
JP  2003224337 A  8/2003
(Continued)

*Primary Examiner* — Dwayne Bost
*Assistant Examiner* — Darlene M Ritchie
(74) *Attorney, Agent, or Firm* — Gokalp Bayramoglu

(57) ABSTRACT

The present disclosure provides a touch sensing device and a method for fabricating the same. The touch sensing device comprises a touch panel and a flexible printed circuit board, wherein the touch panel comprises a first bonding mark and the flexible printed circuit board has a bonding surface bonded to the touch panel and has a non-bonding surface. The flexible printed circuit board comprises a second bonding mark disposed on the non-bonding surface. The second bonding mark and the first bonding mark have a relationship of contraposition.

15 Claims, 8 Drawing Sheets

(51) Int. Cl.
*H05K 1/02* (2006.01)
*H01R 12/62* (2011.01)
*H05K 3/00* (2006.01)
*H05K 3/32* (2006.01)
*H05K 3/36* (2006.01)
*H05K 3/46* (2006.01)
*H01L 23/544* (2006.01)
*G06F 3/02* (2006.01)

(52) U.S. Cl.
CPC ............ *H05K 2201/10053* (2013.01); *H05K 2201/10128* (2013.01); *H05K 2203/166* (2013.01); *Y10T 29/49105* (2015.01)

(56) References Cited

U.S. PATENT DOCUMENTS

| | | | | |
|---|---|---|---|---|
| 5,768,107 | A * | 6/1998 | Ouchi et al. | 361/792 |
| 5,876,884 | A * | 3/1999 | Maeda et al. | 430/22 |
| 5,949,502 | A * | 9/1999 | Matsunaga et al. | 349/40 |
| 6,050,830 | A * | 4/2000 | Tanaka | 439/67 |
| 6,128,070 | A * | 10/2000 | Peng | 355/53 |
| 6,266,119 | B1 * | 7/2001 | Takahashi et al. | 349/149 |
| 6,472,820 | B1 * | 10/2002 | Mo | 313/581 |
| 6,498,640 | B1 * | 12/2002 | Ziger | 355/53 |
| 6,617,702 | B2 * | 9/2003 | Hsu et al. | 257/797 |
| 7,480,026 | B2 * | 1/2009 | Fujita | 349/149 |
| 7,633,564 | B2 * | 12/2009 | Hong et al. | 349/12 |
| 7,750,457 | B2 * | 7/2010 | Seko | 257/688 |
| 7,965,366 | B2 * | 6/2011 | Shie | 349/150 |
| 8,144,472 | B2 * | 3/2012 | Teng et al. | 361/749 |
| 8,274,634 | B2 * | 9/2012 | Oikawa et al. | 349/150 |
| 8,289,492 | B2 * | 10/2012 | Saimen | 349/152 |
| 8,436,482 | B2 * | 5/2013 | Yamaguchi | 257/797 |
| 8,513,821 | B2 * | 8/2013 | Yao et al. | 257/797 |
| 8,587,537 | B2 * | 11/2013 | Matsubara | 345/173 |
| 8,754,332 | B2 * | 6/2014 | Sumida et al. | 174/254 |
| 8,774,576 | B2 * | 7/2014 | Shiraishi | 385/33 |
| 8,928,159 | B2 * | 1/2015 | Chang et al. | 257/797 |
| 9,006,905 | B2 * | 4/2015 | Nakamura | 257/774 |
| 2001/0008790 | A1 * | 7/2001 | Chen et al. | 438/401 |
| 2002/0012096 | A1 * | 1/2002 | Uchiyama | 349/187 |
| 2002/0027634 | A1 * | 3/2002 | Kang et al. | 349/150 |
| 2003/0053056 | A1 * | 3/2003 | Ohazama | 356/401 |
| 2003/0227593 | A1 * | 12/2003 | Miki et al. | 349/151 |
| 2004/0036833 | A1 * | 2/2004 | Monzen | 349/158 |
| 2005/0233611 | A1 * | 10/2005 | Sung et al. | 439/67 |
| 2007/0009813 | A1 * | 1/2007 | Fujita | 430/22 |
| 2008/0030666 | A1 * | 2/2008 | Abe et al. | 349/150 |
| 2008/0106738 | A1 * | 5/2008 | Kim | 356/399 |
| 2008/0223612 | A1 * | 9/2008 | Muramatsu et al. | 174/267 |
| 2008/0227308 | A1 * | 9/2008 | Fujii et al. | 439/66 |
| 2009/0246891 | A1 * | 10/2009 | Sato et al. | 438/14 |
| 2009/0283300 | A1 * | 11/2009 | Grunthaner | 174/254 |
| 2011/0115057 | A1 * | 5/2011 | Harn et al. | 257/620 |
| 2011/0132642 | A1 * | 6/2011 | Shinoda et al. | 174/254 |
| 2011/0205183 | A1 * | 8/2011 | Sugihara | 345/174 |
| 2012/0057312 | A1 * | 3/2012 | Yoo et al. | 361/749 |
| 2012/0190220 | A1 * | 7/2012 | Lee et al. | 439/67 |
| 2012/0319980 | A1 * | 12/2012 | Nagaoka et al. | 345/173 |
| 2013/0161075 | A1 * | 6/2013 | Lee et al. | 174/254 |
| 2013/0175154 | A1 * | 7/2013 | Takahashi | 200/600 |

FOREIGN PATENT DOCUMENTS

JP 2007273578 A * 10/2007
TW 200810643 2/2008

* cited by examiner

TOUCH SENSING DEVICE AND A METHOD OF FABRICATING THE SAME USING BONDING MARKS ON NON-BONDING SURFACE OF FPCB

BACKGROUND OF THE INVENTION

This Application claims the benefit of the People's Republic of China Application No. 201110401077.6, filed on November 27, 2011.

FIELD OF THE INVENTION

The present disclosure relates to a touch sensing device. More particularly, the present disclosure relates to a touch sensing device having a bonding mark for contraposition.

DESCRIPTION OF THE RELATED ART

In a known fabricating process of touch sensing devices, the process of bonding a touch panel with a flexible printing circuit generally utilizes a charge coupled device (CCD) to get a bonding mark disposed on the touch panel and flexible printing circuit board for positioning.

However, with a touch sensing device having a single-board touch panel as example, since a mask layer is directly disposed on the touch panel, the charge coupled device cannot perform contraposition between the touch panel and the flexible printing circuit board. With reference to FIG. 1, FIG. 1 is a schematic diagram of bonding a traditional touch sensing device, which is drawn with an explored view for conveniently explaining the position relationship between each component of the touch sensing device. As shown in FIG. 1, a touch panel 120 has an upper side 142 and a lower side 144, which are disposed correspondingly, and a part of the area of lower side 144 of the touch panel 120 is disposed with a mask layer 122 as a mask area. Generally, the mask layer 122 is disposed on peripheral area of the touch panel 120 for overlaying and hiding a conductive circuit on the periphery of the touch panel 120. A bonding mark 128 of the touch panel 120 is further disposed on the mask layer 122.

In addition, a flexible printing circuit board 130 has a bonding surface 132 and a non-bonding surface 134, which are correspondingly disposed, wherein the bonding surface 132 is opposite to the mask layer 122 of the touch panel 120. Further, a bonding mark 138 of the flexible printing circuit board 130 can be disposed on the bonding surface 132, wherein the bonding mark 138 is opposite to the bonding mark 128 of the touch panel 120. Furthermore, the touch panel 120 and the flexible printing circuit board 130 are bonded with each other by an adhesive 126.

Accordingly, it is assumed that the contraposition is performed from the upper side 142 of the touch panel 120 (direction 150), wherein the bonding mark 128 of the touch panel 120 and the bonding mark 138 of the flexible printing circuit board 130 cannot be positioned by naked eve or charge coupled device (CCD) because of obstruction by the mask layer 122. In addition, if the contraposition is performed from the non-bonding surface 134 of the flexible printing circuit board 130 (direction 140), since material of the flexible printing circuit board 130 is normally translucent, and current charge coupled device (CCD) cannot go through translucent material to distinguish bonding mark 128 of the touch panel 120, the contraposition can only he manually performed by naked eye, not by charge coupled device.

In view of this, if the contraposition and bond of the touch sensing device is performed at the position of the mask layer, the fabricating process of the touch sensing device reduces the reliability of the touch sensing device because of deficient precision. Therefore, it is necessary to seek a new contraposition design of the touch sensing device to improve and avoid the foregoing problems.

SUMMARY OF THE INVENTION

The present disclosure improves mark position of a bonding mark of a touch sensing device, so as to make the bonding mark of the touch panel and the bonding mark of a flexible printing circuit board have a relationship of contraposition between them, and the contraposition can be simply performed by an optical sensing device or by naked eye, thereby enhancing precision of the contraposition to improve the reliability of the touch sensing device.

An embodiment of the present disclosure provides a touch sensing device comprising a touch panel, which comprises a first bonding mark, and a flexible printing circuit board, which has a bonding surface that bonded to the touch panel and a non-bonding surface. The flexible printing circuit board further comprises a second bonding mark disposed on the non-bonding surface. Wherein the second bonding mark and the first bonding mark form a relationship of contraposition.

Another embodiment of the present disclosure provides a method of fabricating a touch sensing device, wherein the method comprises the steps of: providing a touch panel and a flexible printing circuit board, wherein the touch panel comprises a first bonding mark, and the flexible printing circuit board has a bonding surface that used for bonding to the touch panel and a non-bonding surface. The flexible printing circuit board further comprises a second bonding mark disposed on the non-bonding surface. After that, bonding the bonding surface of the flexible printing circuit board to the touch panel through the contraposition between the first bonding mark and the second bonding mark.

Therefore, in the fabricating, process of the present disclosure, the touch sensing device is designed for providing an optical sensing device for automatically positioning the touch panel and the flexible printing circuit board so as to increase efficiency and reduce the manpower demand for reducing the production cost, thereby increasing the precision of contraposition and enhancing the reliability of the bonding process to increase production yield of the touch sensing device.

DETAILED DESCRIPTION OF THE EMBODIMENTS

Figure 1:
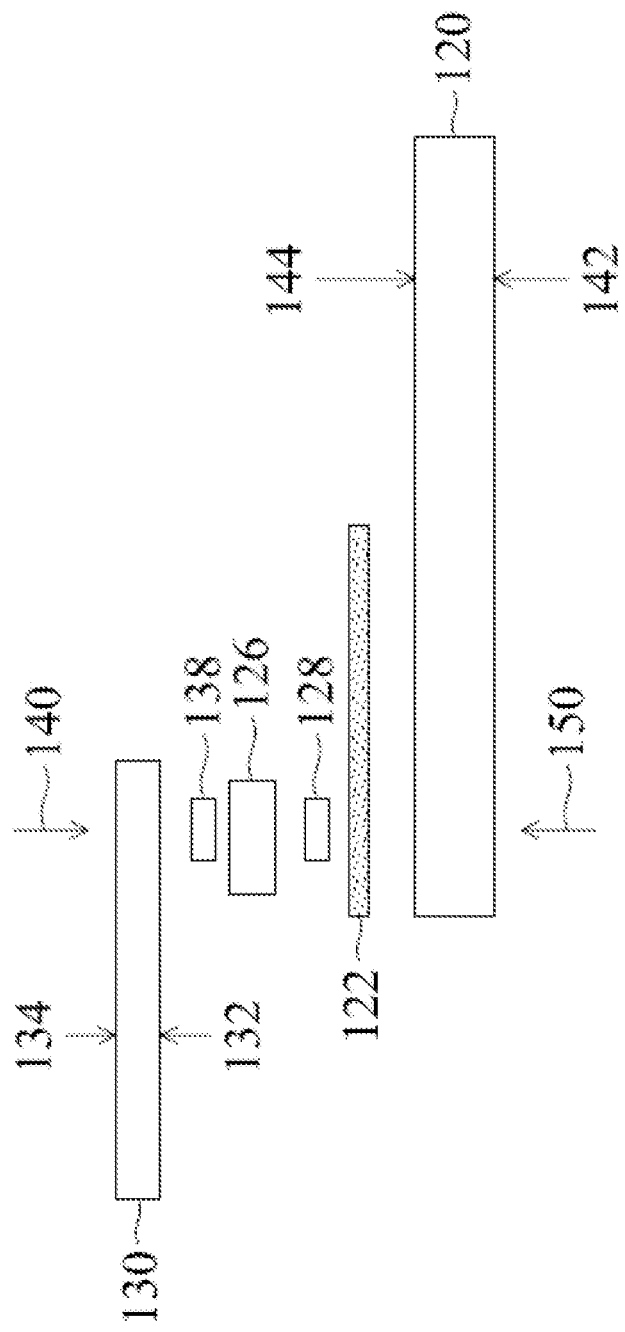
FIG. 1 is a schematic diagram of bonding a traditional touch sensing device.

In the following descriptions accompanied with drawings of each embodiment, those similar or same parts all use same drawing numbers. In the drawings, shape or thickness of each embodiment can be amplified, and marked with simplified or convenient symbols. Furthermore, each component in the drawings is described separately, but those components that have not been shown or described are known to the person skilled in the art.

Touch sensing device of the present embodiment can include a single-board touch panel, a double-board touch panel, or a hybrid touch panel, wherein a mask layer can be disposed on the touch panel. The double-board touch panel comprises a protective substrate (cover lens) and a touch substrate and the single-board touch panel is designed to form a touch sensing electrode directly on the protective substrate, so as to omit a touch substrate as in the double-board touch panel. For convenient description, the following exemplary embodiments are illustrated with respect to the single-board touch panel.

Figure 2:
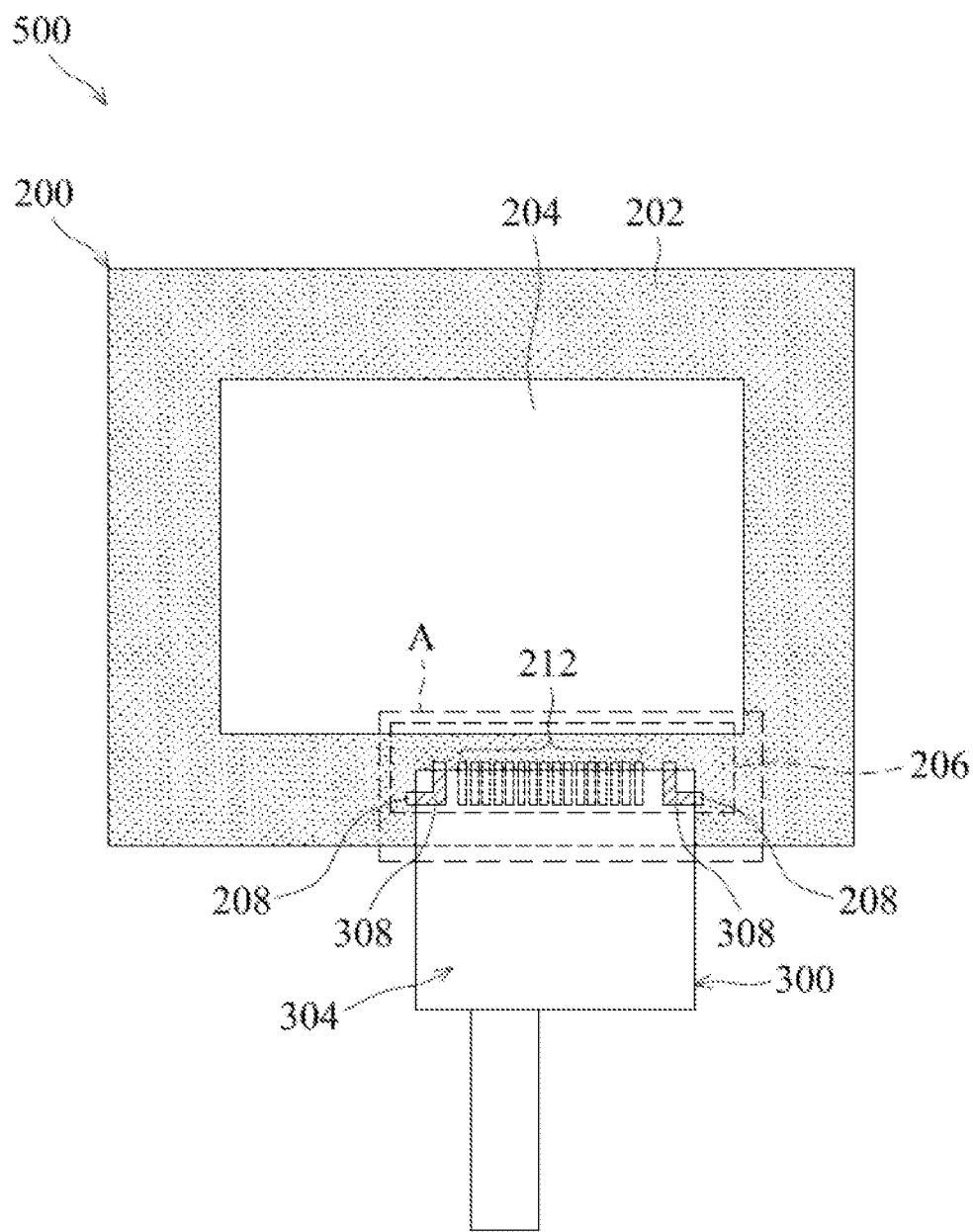
FIG. 2 is a top view diagram of a touch sensing device in accordance with an embodiment of the present disclosure.

With reference to FIG. 2, FIG. 2 is a top view diagram of a touch sensing device in accordance with an embodiment of the present disclosure. As depicted, the touch sensing device 500 of the present embodiment comprises a touch panel 200 and a flexible printing circuit board (FPC) 300. The touch panel 200 comprises a first bonding mark 208, and the flexible printing circuit board 300 has a bonding surface (not shown) that is bonded to the touch panel 200 and a non-bonding surface 304. The flexible printing circuit board 300 further comprises a second bonding mark 308, wherein the second bonding mark 308 is disposed on the non-bonding surface 304 to form a relationship of contraposition with the first bonding mark 208. More particularly, the second bonding mark 308 is disposed on the non-bonding surface 304 with a mode of aligning at the side edge of the flexible printing circuit board 300.

The touch panel 200 further comprises a visible area 204, a mask area 202 that is surrounding the visible area 204, a bonding area 206, and a terminal wire interface 212. In practical design, the mask area 202 can be formed by coating a mask layer on the substrate of the touch panel 200, and the bonding area 206 is disposed inside the mask area 202. The so-called bonding area 206 is defined as an area provided by the touch panel 200 for bonding with the flexible printing circuit board 300. Moreover, the first bonding mark 208 and the terminal wire interface 212 are both further disposed inside the bonding area 206.

As described above, fabricating process of the touch sensing device of the present disclosure is not affected by the mask area 202 on the touch panel 200. The fabricating process utilizes the second bonding mark 308 on the non-bonding surface304 of the flexible printing circuit board 300 to perform contraposition with the first bonding mark 208 disposed on the touch panel 200, wherein shapes and numbers of the first bonding mark 208 and the second bonding mark 308 are not limited by the embodiments of the present disclosure. Shapes and numbers of the first bonding mark 208 and the second bonding mark 308 of the present embodiments that are disclosed by the present specification correspond to each other. Shape of the bonding mark can be L-shaped, and multiple first bonding marks 208 and second bonding marks 308 can occur in pairs, which are symmetrically disposed with a left and right mirror reflection, thereby ensuring precision of the contraposition of front, back, left, and right positions. Certainly, except for the foregoing L-shape, the first bonding mark 208 and the second bonding mark 308 can also be designed as T-shape, cross shape and the like.

Figure 3:
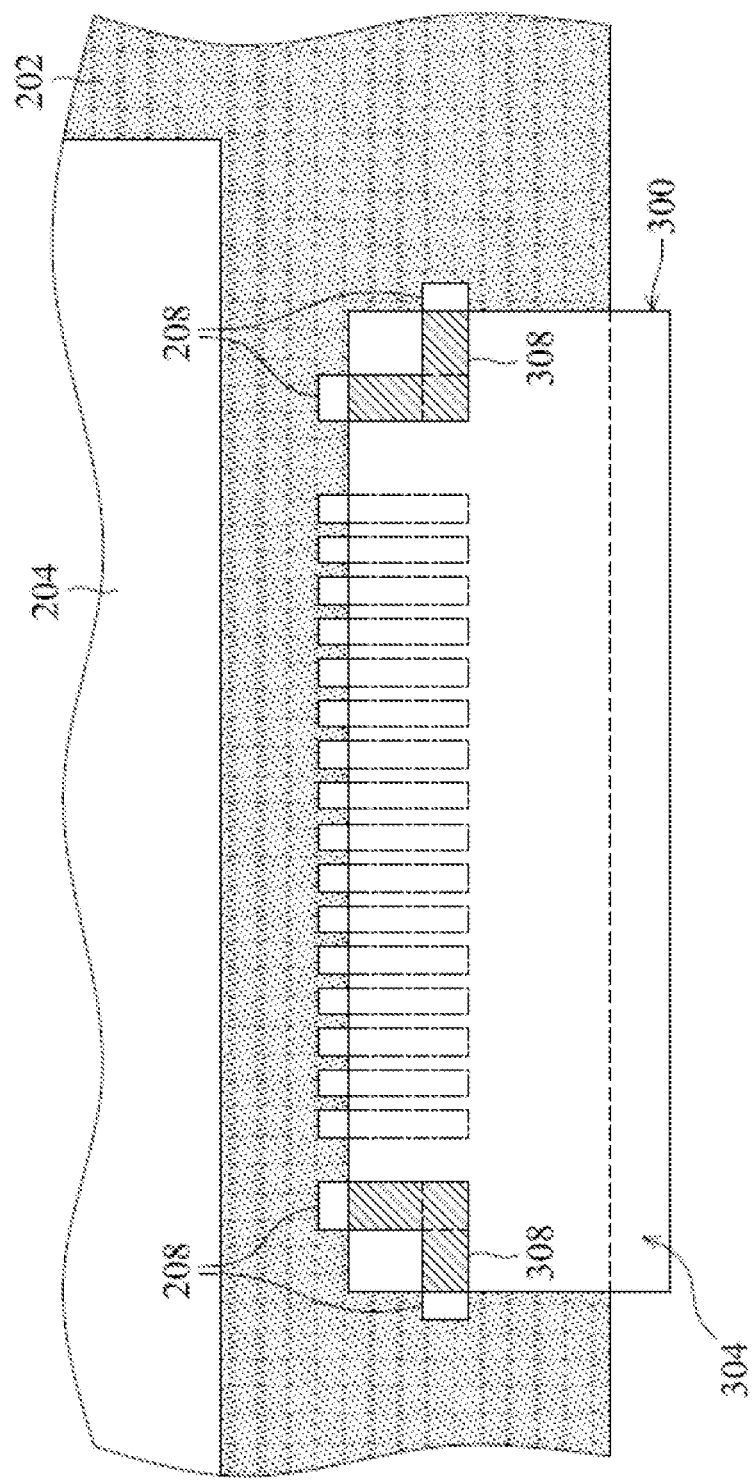
FIG. 3 is a partial enlargement diagram of part A of FIG. 2.

With reference to FIG. 3, FIG. 3 is a partial enlargement diagram of part A of FIG. 2. More clearly, in FIG. 3, when the flexible printing circuit board 300 is bonded to the touch panel 200, since the second bonding mark 308 of the flexible printing circuit board 300 is designed on the non-bonding surface 304, the fabricating process can perform the contraposition using an optical sensing device such as charge coupled device (CCD) or naked eye from an angle of top view of FIG. 2, so as to utilize the first bonding mark 208, which has been disposed on a preset position of the mask area 202 as front, back, left and right contraposition benchmarks of the second bonding mark 308. Since the first bonding mark 208 and the second bonding mark 308 of the present embodiment are both designed as L-shaped, the second bonding mark 308 would overlap with a part of the first bonding mark 208.

The following descriptions would further describe the touch panel 200 and the flexible printing circuit board 300 respectively.

Figure 4:
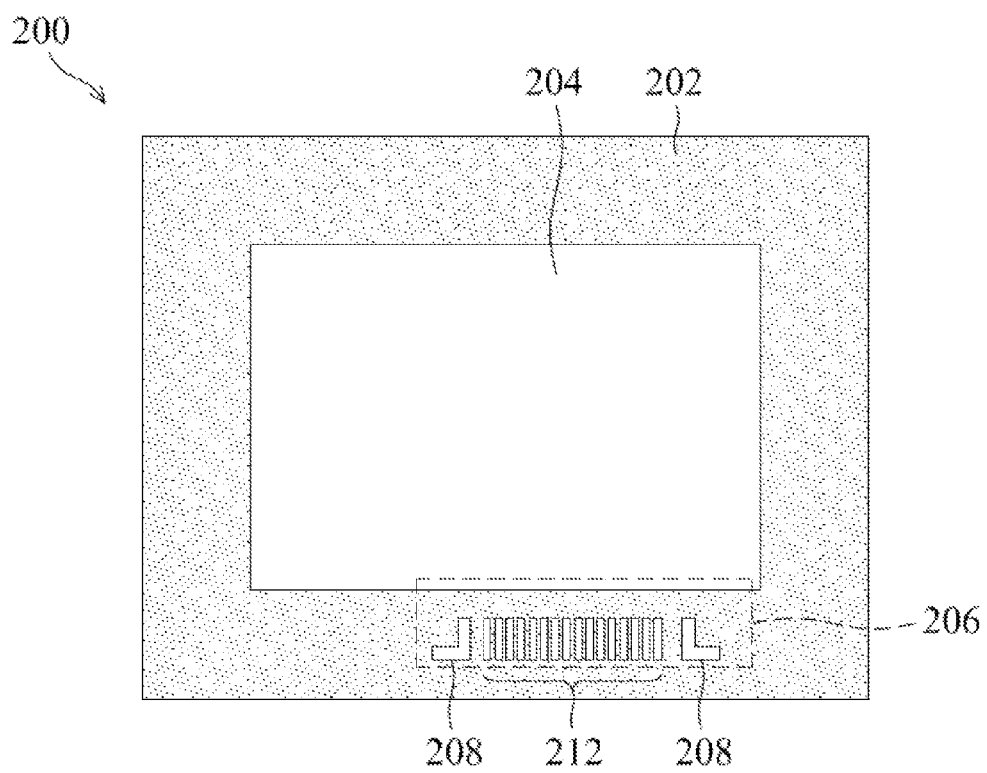
FIG. 4 is a top view diagram of a touch panel in accordance with an embodiment of the present disclosure.

FIG. 4 is a top view diagram of the touch panel 200 in accordance with an embodiment of the present disclosure, which is used for disclosing the back side of the touch panel 200. The so-called back side is a surface which would not be touched by users in actual use. As shown in FIG. 4, a terminal wire interface 212, having a fence-like shape, is disposed inside the bonding area 206 as an external electrical connecting interface for the touch panel 200. In addition, the paired first bonding marks 208 of the present embodiment are symmetrically disposed at two opposite sides (i.e., left and right sides) of the terminal wire interface 212 with left and right mirror reflection, and respectively separated from the terminal wire interface 212 for a distance. Since the paired first bonding marks 208 have a relationship of left and right mirror reflection, the first bonding mark 208 shown at right side of figure is L-shaped and the first bonding mark 208 shown at left side of figure is reversely L-shaped.

Figure 5:
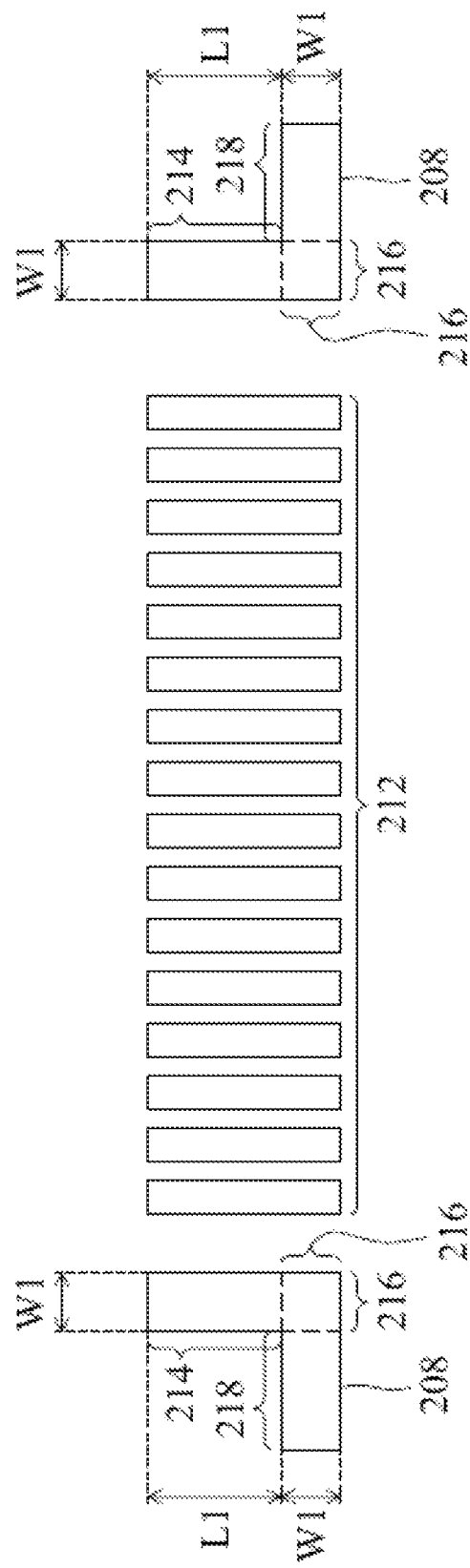
FIG. 5 is a partial enlargement diagram of a bonding area of FIG. 4.

FIG. 5 is a partial enlargement diagram of a bonding area 206 of FIG. 4. As shown in FIG. 5, the first bonding mark 208 has a first base part 216 and at least two first extending parts 214 and 218, wherein one end of first extending parts 214 and 218 respectively connects to two adjacent sides of the first base part 216, and other end respectively extends along different directions to form the L-shaped mark. Specifically, the first extending part 214 extends along a vertical direction and the first extending part 218 extends along a horizontal direction. The formed first extending parts 214 and 218 have width W1 and length L1.

Figure 6A:
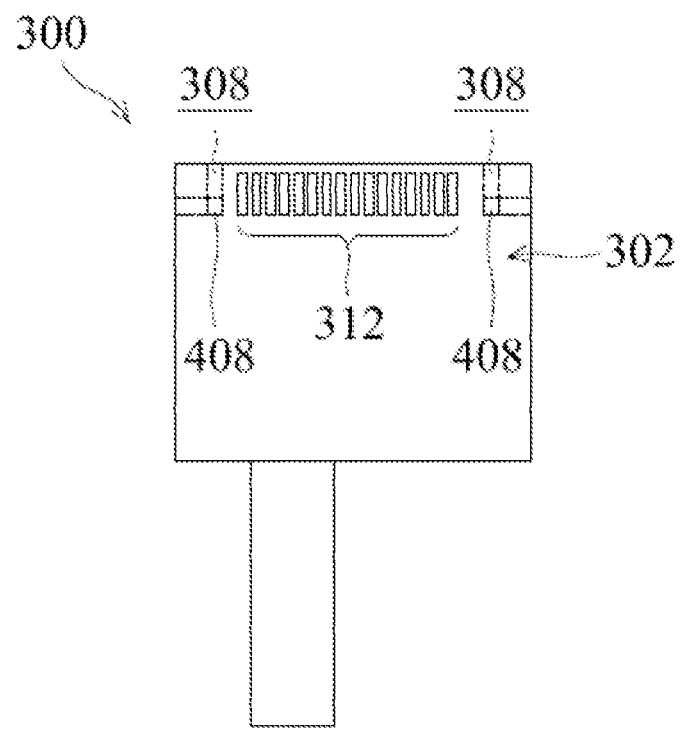
FIG. 6a is a top view diagram of a non-bonding surface of a flexible printing circuit board in accordance with an embodiment of the present disclosure.
Figure 6B:
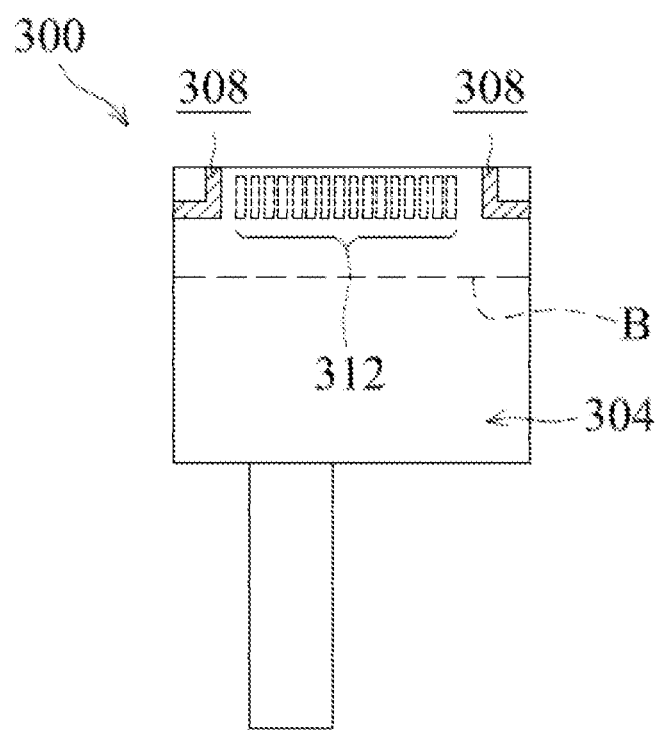
FIG. 6b is a top view diagram of a bonding surface of the flexible printing circuit board in accordance with the embodiment of the present disclosure.

With reference to FIG. 6a and FIG. 6b simultaneously, FIG. 6a and FIG. 6b are top view diagrams of bonding surface 302 and non-bonding surface 304 of the flexible printing circuit board 300 in accordance with an embodiment of the present disclosure. The flexible printing circuit board 300 of the present embodiment can be formed by high polymer translucent material. As shown in FIG. 6a, an electrical pin interface 312, having a fence-like shape, is disposed on the bonding surface 302 of the flexible printing circuit board 300 for electrically connecting the terminal wire interface 212 when the flexible printing circuit board 300 is bonded to the touch panel 200, wherein the electrical pin interface 312 can be formed by high polymer transparent material, transparent conductive layer, metal layer, or other known conductive materials. As shown in FIG. 6b, the second bonding mark 308 that is designed on the non-bonding surface 304 also has a paired design, and is symmetrically disposed with the left and right mirror reflection. Moreover, space between the paired second bonding marks 308 is corresponding to the space between the paired first bonding marks 208 as shown in FIG. 4.

Figure 7:
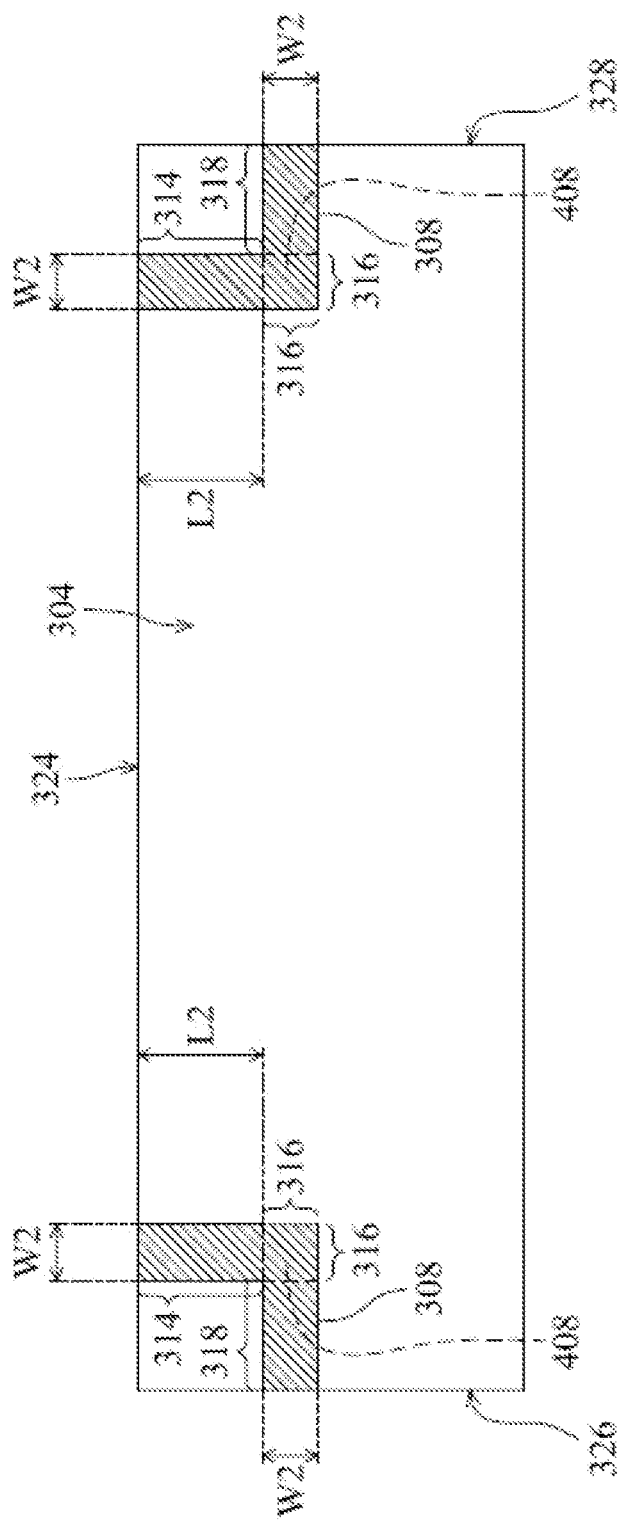
FIG. 7 is a partial enlargement diagram of part B of FIG. 6b.

With reference to FIG. 7, FIG. 7 is a partial enlargement diagram of part B of FIG. 6b. As shown in FIG. 7, the second bonding mark 308 comprises a second base part 316 and at least two second extending parts 314 and 318, wherein one end of the second extending parts 314 and 318 is respectively connected to two adjacent sides of the second base part 316, and other end extends along different directions to form the L-shaped mark. Specifically, the second extending part 314 extends along a vertical direction, and the second extending part 318 extends along a horizontal direction. The second extending part 314 that extends along the vertical direction is aligned at the side edge 324 of the flexible printing circuit board 300, and the two left and right second extending parts 318 that extend along the horizontal direction are respectively extended to align at the side edges 326 and 328 of the flexible printing circuit board 300. The formed second extending parts 314 and 318 have width W2 and length L2.

In the design, width W2 of the second extending parts 314 and 318 of the present embodiment is equal to width W1 of the first extending parts 214 and 218 as shown in FIG. 5, and length L1 of the first extending parts 214 and 218 is greater than length L2 of the second extending parts 314 and 318, so that part of first extending parts 214 and 218 can be exposed outside the flexible printing circuit board 300 under the condition that size of the second base part 316 is equal to size of the first base part 216, when the flexible printing circuit board 300 is bonded to the touch panel 200. Thus, the first bonding mark 208 can achieve the purpose of providing a contraposition benchmark. Specifically, the second extending part 314 (vertical extending) of the second bonding mark 308 and the first extending part 214 (vertical extending) of the first bonding mark 208 are bonding marks for positioning left and right, and the second extending part 318 (horizontal extending) of the second bonding mark 308 and the first extending part 218 (horizontal extending) of the first bonding mark 208 are bonding marks for positioning up and down.

Furthermore, in an embodiment of the present disclosure, as shown in FIG. 6a, a third bonding mark 408 is further selectively disposed on the bonding surface 302 of the flexible printing circuit board 300, wherein the third bonding mark 408 is designed as corresponding to at least one part of the second bonding mark 308 on the non-bonding surface 304 of the flexible printing circuit board 300. The present disclosure does not limit shape, size, and number of the third bonding mark 408. As long as the flexible printing circuit board 300 and the touch panel 200 are being connected, the third bonding mark 408 can be further used for positioning the first bonding mark 208 of the touch panel 200, and usually used for providing a required contraposition benchmark for naked eye.

The third bonding mark 408 of the present embodiment can be designed as corresponding to shape, size and number of the second base part 316 of the second bonding mark 308. Therefore, in view of the whole touch sensing device 500 after bonding, the first base part 216 of the first bonding mark 208, the second base part 316 of the second bonding mark 308, and the third bonding mark 408 are completely overlapped, wherein the third bonding mark 408 and the first bonding mark 208 are superposed in the structure.

Figure 8:
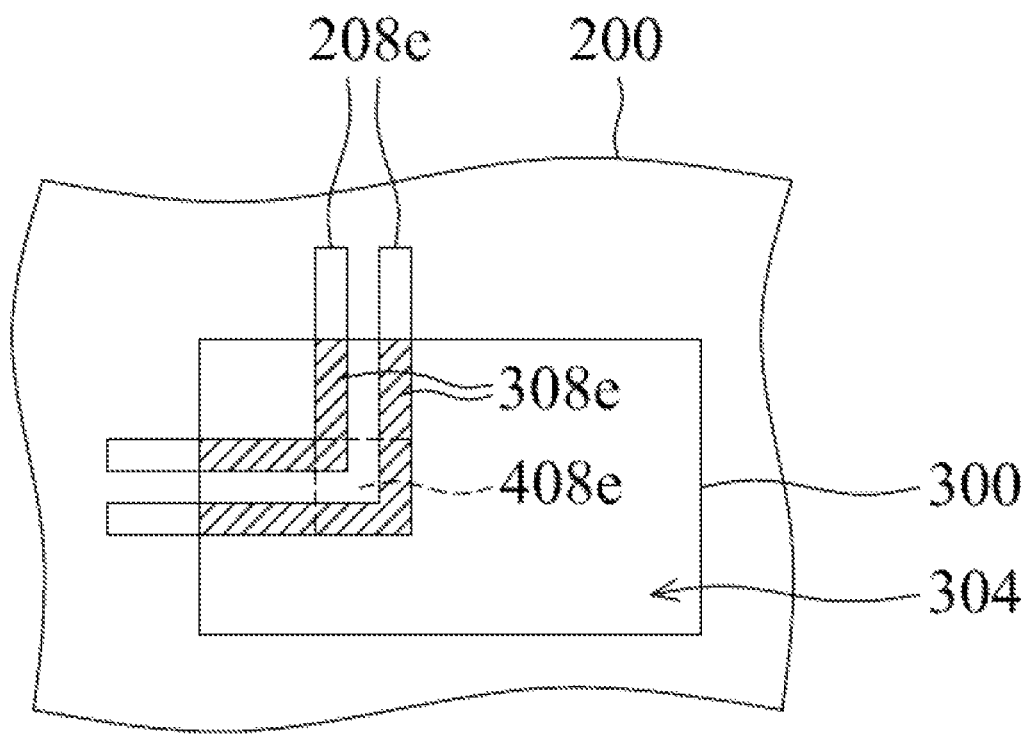
FIG. 8 is a top view diagram of bonding marks of a touch sensing device in accordance with another embodiment of the present disclosure.

Furthermore, in another embodiment of the present disclosure, the so-called L-shape bonding mark can be further deformed. With reference to FIG. 8, FIG. 8 is a top view diagram of bonding marks of a touch sensing device in accordance with another embodiment of the present disclosure. As shown, shapes and numbers of first bonding mark 208e and second bonding mark 308e in the present embodiment are also corresponding to each other, and shapes are designed as double L-shape. Accordingly, in the present embodiment, the first bonding mark 208e that disposed on the touch panel 200 can also form a relationship of contraposition with the second bonding mark 308e disposed on the non-bonding surface 304 of the flexible printing circuit board 300, so as to achieve precise front, back, left and right contraposition.

In addition, the present embodiment of FIG. 8 can further dispose a third bonding mark 408e on the bonding surface (not shown) of the flexible printing circuit board 300, the design thereof is same as the foregoing embodiment, and not described here again. When the flexible printing circuit board 300 is bonded to the touch panel 200, the third bonding mark 408e can be a contraposition benchmark for further positioning the first bonding mark 208e.

One embodiment of the present disclosure further provides a method of fabricating a touch sensing device. Since the present embodiment is describing the fabricating method based on the embodiments of FIGS. 3, 5 and 7, detailed structure of the touch panel 200 and the flexible printing circuit board 300 are not described here again. Firstly, a touch panel 200 and a flexible printing circuit board 300 are provided, wherein the touch panel 200 comprises a first bonding mark 208, and the flexible printing circuit board 300 has a bonding surface 302 that is bonded to the touch panel 200 and has a non-bonding surface 304, wherein the flexible printing circuit board 300 further comprises a second bonding mark 308 disposed on the non-bonding surface 304.

Subsequently a contraposition process is performed from an angle of the non-bonding surface 304 of the flexible printing circuit board 300. The contraposition process utilizes the first bonding mark 208 as the contraposition benchmark for the second bonding mark 308. Since lengths of the first extending parts 214 and 218 of the first bonding mark 208 of the present embodiment are respectively greater than that of the second extending parts 314 and 318 of the second bonding mark 308, the second bonding mark 308 would be overlapped with part of the first bonding mark 208 to form a relationship of contraposition.

Finally, performing a bonding process according to the contraposition between the first bonding mark 208 and the second bonding mark 308 for bonding the bonding surface 302 of flexible printing circuit board 300 to the touch panel 200.

In conclusion, in the process of bonding the flexible printing circuit board and the touch panel, the present disclosure can conveniently perform the contraposition by naked eye, and also perform an automatic contraposition and bonding process by using a charge coupled device (CCD), through an improved design of the bonding marks on the touch panel and the flexible printing circuit board. More importantly, in the process of bonding the flexible priming circuit board to a touch panel having a mask area, since the bonding mark of the flexible printing circuit board of the present disclosure is disposed on the non-bonding surface of the flexible printing circuit board, the contraposition performed by the charge coupled device would not be obstructed by the mask area, thereby automatically positioning the bonding mark that is disposed on the touch panel. Overall, the present disclosure can increase the production efficiency, reduce the production cost, and enhance the reliability of the bonding process, thereby improving the production yield of the touch sensing device.

Although the present disclosure refers to the above described embodiments, it is not intended to limit the scope of the present disclosure. It is apparent to those skilled in the art that modifications and substitutions to the described embodiments may be made without departing from the spirit. and scope of the present disclosure. Accordingly, the scope of the present disclosure is further defined by the attached claims.

What is claimed is:

1. A touch sensing device, comprising:
   a touch panel comprising a first bonding mark; and
   a flexible printing circuit board having a bonding surface bonded to the touch panel and a non-bonding surface, wherein the flexible printing circuit board further comprises a second bonding mark disposed on the non-bonding surface, and wherein the second bonding mark and the first bonding mark form a relationship of contraposition, wherein the first bonding mark has at least one contraposition portion, and wherein the contraposition portion is uncovered and exposed from the flexible printing circuit board to perform a contraposition benchmark to the second bonding mark, upon bonding the flexible printing circuit board to the touch panel,
   wherein the first bonding mark comprises a first base part and at least two first extending parts, wherein the second bonding mark comprises a second base part and at least two second extending parts, and wherein one end of each of the second extending parts is aligned at a side edge of the flexible printing circuit board, wherein each of the two first extending parts has the contraposition portion, and wherein the contraposition portion is aligned with the end of the second extending part at the side edge of the flexible printing circuit board, upon bonding the flexible printing circuit to the touch panel, and
   wherein the first extending parts and the second extending parts have the same width, and wherein the length of the first extending parts is greater than the length of the second extending parts for defining the contraposition portion.

2. The touch sensing device of claim 1, wherein the first bonding mark and the second bonding mark are corresponding to each other, further wherein the first bonding mark and the second bonding mark respectively are paired designs, and the paired designs are symmetrical mirroring.

3. The touch sensing device of claim 1, wherein the ends of the two second extending parts are respectively aligned at two adjacent sides edges of the flexible printing circuit board.

4. The touch sensing device of claim 1, wherein the first bonding mark and the second bonding mark have L-shape, T-shape, or cross shape.

5. The touch sensing device of claim 1, further comprising:
   a third bonding mark disposed on the bonding surface of the flexible printing circuit board, wherein the second base part of the second bonding mark and the third bonding mark have the same shape and the same size.

6. The touch sensing device of claim 5, wherein the third bonding mark and the first bonding mark are superposed on each other.

7. The touch sensing device of claim 1, wherein the touch panel further comprises:
   a mask area:
   a bonding area disposed on the mask area, wherein the first bonding mark is disposed on the bonding area.

8. The touch sensing device of claim 7, wherein, the touch panel further comprises a terminal wire interface disposed on the bonding area and separated from the first bonding mark for a distance; and the flexible printing circuit board further comprises an electrical pin interface disposed on the bonding surface and electrically connected to the terminal wire interface.

9. The touch sensing device of claim 1, wherein the first bonding mark has a first L-shape mark and a first reversed L-shape mark, the second bonding mark has a second L-shape mark and a second reversed L-shape mark, and wherein the contraposition portion of the first L-shape mark is aligned with the second L-shape mark, whereas the contraposition portion of the first reversed L-shape mark is aligned with the second reversed L-shape mark, upon bonding the flexible printing circuit board to the touch panel.

10. The touch sensing device of claim 9, wherein the touch panel further comprises:
    a terminal wire interface disposed on the bonding area and between the first L-shape mark and a first reversed L-shape mark, and
    the flexible printing circuit board further comprising an electrical pin interface disposed on the bonding surface.

11. The touch sensing device of claim 9, wherein the first bonding mark has at least one first auxiliary mark, the second bonding, mark has at least one second auxiliary mark, and wherein the contraposition portion of the first auxiliary mark is aligned with the second auxiliary mark, upon bonding the flexible printing circuit board to the touch panel.

12. The touch sensing device of claim 11, further comprising a third bonding mark disposed on the bonding surface of the flexible printing circuit board, wherein the third bonding mark overlays a portion of the first bonding mark and a portion of the second bonding mark.

13. A method of fabricating a touch sensing device, comprising the steps of:
    providing a touch panel and a flexible printing circuit board, wherein the touch panel comprises a first bonding mark, the flexible printing circuit board has a bonding surface used for bonding to the touch panel and a non-bonding surface, wherein the flexible printing circuit board further comprises a second bonding mark disposed on the non-bonding surface, wherein the first bonding mark has at least one contraposition portion; and
    bonding the bonding surface of the flexible printing circuit board to the touch panel according to the contraposition between the first bonding mark and the second bonding mark, wherein the contraposition portion is uncovered and exposed from the flexible printing circuit board to perform a contraposition benchmark to the second bonding mark upon bonding the flexible printing circuit board to the touch panel,
    wherein the first bonding mark comprises a first base part and at least two first extending parts, wherein the second bonding mark comprises a second base part and at least two second extending parts, and wherein one end of each of the second extending parts is aligned at a side edge of the flexible printing circuit board, wherein each of the two first extending parts has the contraposition portion, and wherein the step of bonding the bonding surface of the flexible printing circuit board to the touch panel further comprises aligning the contraposition portion with the end of the second extending part at the side edge of the flexible printing circuit board, and
    wherein the first extending parts and the second extending parts have the same width, and wherein the length of the first extending parts is greater than the length of the second extending parts for defining the contraposition portion.

14. The method of fabricating the touch sensing device of claim 13, wherein the first bonding mark and the second bonding mark are L-shape, T-shape, or cross shape.

15. The method of fabricating the touch sensing device of claim 13, wherein the first bonding mark is disposed on a bonding area in a mask area of the touch panel.

* * * * *